United States Patent
Ben-Ayun et al.

(10) Patent No.: US 6,717,484 B2
(45) Date of Patent: Apr. 6, 2004

(54) CIRCUITS FOR USE IN RADIO COMMUNICATIONS

(75) Inventors: Moshe Ben-Ayun, Shoham (IL); Mark Rozental, Rehovot (IL); Gabi Nocham, Tel Aviv (IL)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/153,997

(22) Filed: May 23, 2002

(65) Prior Publication Data

US 2003/0006854 A1 Jan. 9, 2003

(30) Foreign Application Priority Data

Jun. 29, 2001 (GB) .............................................. 0116009

(51) Int. Cl.[7] ................................................ H03L 1/00
(52) U.S. Cl. ...................................... 331/175; 327/156
(58) Field of Search ............................ 331/175, 11, 60, 331/1 R, 41, 88; 327/147, 156; 375/373–376

(56) References Cited

U.S. PATENT DOCUMENTS

| | | | | |
|---|---|---|---|---|
| 4,365,349 A | * | 12/1982 | Ogita et al. ............... | 455/192.2 |
| 4,472,685 A | * | 9/1984 | Dutasta ....................... | 329/325 |
| 4,511,859 A | * | 4/1985 | Dombrowski ................ | 331/11 |
| 5,325,403 A | * | 6/1994 | Siwiak et al. ............... | 375/347 |
| 5,434,888 A | * | 7/1995 | Fukuchi ....................... | 375/307 |
| 5,537,448 A | | 7/1996 | Schwarz et al. | |
| 5,677,737 A | | 10/1997 | den Hollander | |
| 5,950,115 A | * | 9/1999 | Momtaz et al. ............... | 455/73 |
| 5,955,928 A | * | 9/1999 | Smith et al. .................... | 331/2 |
| 6,141,375 A | * | 10/2000 | Ishida .......................... | 375/219 |
| 6,147,562 A | * | 11/2000 | Quirmbach .................. | 331/14 |
| 6,563,888 B1 | * | 5/2003 | Toriyama .................... | 375/340 |

FOREIGN PATENT DOCUMENTS

| | | | |
|---|---|---|---|
| EP | 0186854 A2 | 12/1985 | |
| EP | 0273203 | 12/1986 | |
| JP | 11289268 A | * 10/1999 | ............ H04B/1/26 |

* cited by examiner

Primary Examiner—Timothy P. Callahan
Assistant Examiner—Cassandra Cox
(74) Attorney, Agent, or Firm—Terri S. Hughes; Valerie M. Davis

(57) ABSTRACT

A voltage controlled oscillator (VCO) for connection and operation in a phase locked loop arrangement has two or more operational states in each of which the VCO circuit is operable to provide activation of a selected one of two or more different phase locked loops when connected to the VCO circuit, the VCO circuit including switching means for switching the state of the VCO circuit to allow the operational state of the VCO to be selected.

A frequency synthesizer circuit for use in radio communications to generate a stable frequency signal, the circuit includes the VCO circuit. The synthesizer circuit includes two or more different phase locked loops each having a first state in which the loop is activated and a second state in which the loop is deactivated. At least part of the VCO circuit is connected in and shared by the loops, so that the loop to be activated can be selected by selecting the operational state of the VCO.

22 Claims, 2 Drawing Sheets

CIRCUITS FOR USE IN RADIO COMMUNICATIONS

FIELD OF THE INVENTION

This invention relates to circuits for use in radio communications. In particular, it relates to frequency synthesiser circuits which incorporate a VCO (voltage controlled oscillator) circuit and VCO circuits for use therein. Such circuits are useful in radio transmitters and receivers for generating stable frequency signals.

BACKGROUND OF THE INVENTION

Carrier frequency signals in radio communications transmitters are conventionally generated by a frequency sythesiser circuit. Such a circuit usually includes a VCO connected in a phase locked loop (PLL). The loop, including the VCO, provides an appropriate stable output at a precisely defined frequency. Such a circuit may also be employed to generate a local osillator signal for use in a radio receiver. In many cases the transmitter and receiver are combined in a single transceiver unit.

Multimode transceiver units for use in multiple communications modes or systems having different operating properties have recently become available. These units generally include dedicated synthesiser circuits as well as dedicated transceiver circuits for the separate modes. Unfortunately, the provision of a plurality of such synthesiser circuits to cater for different operating modes in a single transceiver unit considerably increases the size and volume occupied by the circuits as well as their cost of manufacture.

The purpose of the present invention is to provide a frequency synthesiser circuit which facilitates use in a multimode radio transceiver (or transmitter or receiver) in a manner in which these disadvantages are reduced.

U.S. Pat. No. 5,537,448 describes a known VCO circuit arrangement. FIG. 1 shows a PLL wherein between a phase detector and the VCO there are a plurality of switchable loop filters (together with low-pass filters). These are provided for dynamically changing loop bandwidth whilst maintaining the same stability parameters (phase and gain margin). This arrangement does not provide the benefits obtainable with the present invention to be described herein.

SUMMARY OF THE INVENTION

According to the present invention in a first aspect there is provided a VCO (voltage controlled oscillator) circuit for connection in a phase locked loop arrangement wherein the VCO circuit has a plurality of operational states in each of which the VCO circuit is operable to provide activation of a selected one of a plurality of different phase locked loops when connected to the VCO circuit, the VCO circuit including switching means for switching the state of the VCO circuit to allow the operational state of the VCO to be selected.

According to the present invention in a second aspect there is provided a frequency synthesiser circuit for use in radio communications to generate a stable frequency signal, the circuit comprising a VCO (voltage controlled oscillator) circuit for use in a phase locked loop arrangement, the synthesiser circuit being characterised in that it comprises a plurality of different phase locked loops each having a first operable state in which the loop is activated and a second operable state in which the loop is deactivated and a VCO circuit at least part of which is connected in and shared by the loops the VCO circuit having a plurality of operational states in each of which the VCO circuit is operable to provide activation of a selected one of the different phase locked loops, the VCO circuit including switching means for switching the state of the VCO circuit to allow the operational state of the VCO to be selected.

In this specification, 'activate' or 'activated' indicates that a phase locked loop including a VCO is operable to produce r.f. signals of a desired output frequency and 'deactivate' or 'deactivated' indicates that it is not.

VCO devices generally comprise a tuning and resonator portion and an active portion, examples of which are described in more detail later. Where part of the VCO is shared by the phase locked loops in the circuit according to the present invention, the shared part may comprise the active portion of the VCO circuit and preferably also the resonator part of the tuning and resonator portion of the VCO circuit.

The switching means may include a plurality of electrical switches each connected to an associated part of the VCO circuit, whereby the operational state of the VCO circuit and the state of each associated phase locked loop may be selected, each loop being operably activated or operably deactivated by closing of its associated switch in the VCO circuit. Each of the switches may be connected between a voltage source and a corresponding voltage controlled device forming part of the VCO circuit. Each of the voltage controlled devices may comprise a voltage variable capacitance, e.g. a varactor device. Each voltage controlled device may form part of the VCO circuit not shared with the other loops, especially a tuning part of the VCO. Each voltage controlled device may be connected in one of a plurality of control loops, each of the control loops being associated with one of the phased locked loops. The shared part of the VCO may thereby be incorporated in each of the control loops. In such a circuit, each voltage controlled device may control whether or not its associated phase locked loop is operably activated or not by the voltage applied to the voltage controlled device, thereby determining whether it makes a significant contribution to the frequency of oscillations of the VCO (activated) or not (deactivated).

Each of the control loops to which the VCO circuit is connected may include a grounded portion and a non-grounded portion and at least part of the VCO circuit may comprise a common link in each of the control loops between the grounded and non-grounded portions of the control loops. The common link may also comprise the part of the VCO which is shared between the phase locked loops.

The phase locked loops may share a common input terminal to and a common output terminal from the shared part of the VCO. Each of the phase locked loops may include, in a portion of the loop not shared with the other phase locked loops, a capacitor. The capacitors of the different phase locked loops may be connected to the common input terminal to the shared part of the VCO. Where the circuit includes control loops as described earlier, the voltage controlled device of each of the control loops may conveniently be connected through one of the capacitors to the common input terminal of the shared part of the VCO.

Thus, the invention allows two or more PLLs to be connected to and operably associated with the same VCO. Those PLLs could have very different specifications (e.g. loop bandwidth, lock time, noise level requirements, etc) and their phase detectors could be quite different. This is not possible with the VCO described in U.S. Pat. No. 5,537,448 where the switching which occurs is external to the VCO and is straightforward switching between loop filters.

The first and second operational modes obtainable in the frequency synthesiser circuit according to the second aspect of the invention may be modes which allow communication in two different systems, e.g. in a GSM (Global System for Telecommunications) system and a TETRA (Terrestrial Trunked Radio) system. These are different digital systems which are respectively well established and recently emerging systems defined according to known international standards. Preferably, the frequency to be generated in the two systems is not excessively different. For example, it is preferred that the frequency difference between the outputs required in the different systems is not greater than 10 percent, desirably not greater than 5 percent of the mean of the frequencies to be generated.

The present invention beneficially allows a multi-mode radio transceiver unit to be built which is cheaper and occupies less space and has less components than known multi-mode units.

Embodiments of the present invention will be described by way of example with reference to the accompanying drawings, in which:

DESCRIPTION OF EMBODIMENTS OF THE INVENTION

Figure 1:
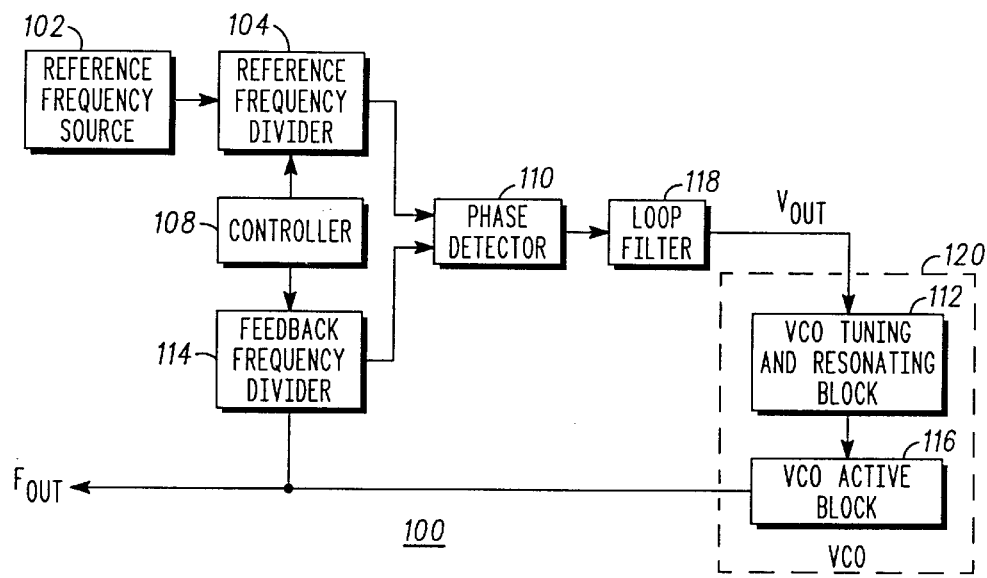
FIG. 1 is a schematic block circuit illustration of a conventional phase locked loop frequency synthesiser circuit.

Reference is now made to FIG. 1, which is a schematic block circuit illustration of a conventional phase locked loop frequency synthesiser circuit, generally referenced as 100. The frequency synthesiser circuit 100 includes a reference frequency source 102, e.g. a crystal oscillator, a reference frequency divider 104, a controller 108, a phase detector 110, a loop filter 118, a VCO 120 and a feedback frequency divider 114. The VCO 120 further includes a VCO tuning and resonating block 112 and a VCO active block 116.

The reference frequency divider 104 is connected to the reference frequency source 102, the controller 108 and the phase detector 110. The feedback frequency divider 114 is connected to the phase detector 110, the controller 108 and the VCO active block 116. The loop filter 118 is connected to the phase detector 110 and to the VCO tuning and resonating block 112. The VCO active block 116 is connected to the VCO tuning and resonating block 112 and to the feedback frequency divider 114.

The reference frequency divider 104 receives a signal, having the frequency $F_R$, from the reference frequency source 102. The reference frequency divider 104 further divides the frequency of this signal by N and provides the resultant signal, having the frequency $F_R/N$, to the phase detector 110. The feedback frequency divider 114 receives a feedback signal, having a frequency $F_{OUT}$, as an output from the VCO active block 116. The feedback frequency divider 114 further divides the frequency of this signal by M and provides the resultant signal, having the frequency $F_{OUT}/M$, to the phase detector 110. The phase detector 110 compares these two signals, generates a respective output control signal and provides it to the loop filter 118. Typically, the loop filter 118 is a low-pass filter. The loop filter 118 integrates the output control signal and provides a resultant output voltage $V_{OUT}$ to the VCO tuning and resonating block 112. Depending on the value of $V_{OUT}$, the VCO tuning and resonating block 112 adjusts the output frequency $F_{OUT}$ so that it is equal to a desired value $$\frac{M}{N} \cdot F_R.$$

Figure 2:
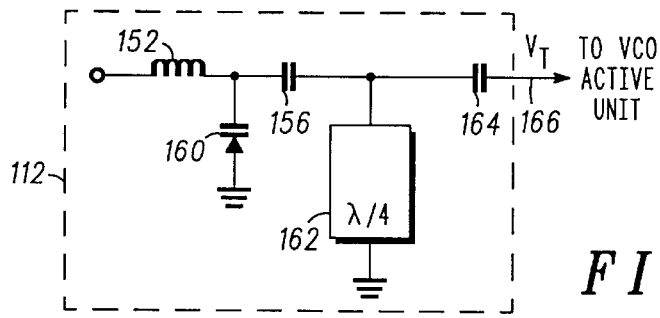
FIG. 2 is a schematic circuit diagram illustrating in detail a VCO tuning and resonating block employed in the circuit of FIG. 1.

Reference is now made to FIG. 2, which is a schematic circuit diagram illustrating in detail the VCO tuning and resonating block 112 of FIG. 1. The voltage $V_{OUT}$ (produced as an output by the loop filter 118 in FIG. 1) is applied as an input to the block 112 to an inductor 152 which is connected to a varactor $VR_C$ 160 and is connected via a capacitor 156 to a resonator 162. An output connection 166 which includes a capacitor 164 leads from the junction between the capacitor 154 and the resonator 162 to the VCO active block 116 (FIG. 1).

Operation of a varactor such as the varactor $VR_C$ (illustrated later with reference to FIG. 5) is such that when the applied voltage is high the capacitance is low and when the applied voltage is high the capacitance is low. Thus, the capacitance of the varactor $VR_F$ 160 is controlled by the output voltage $V_{OUT}$ provided by the loop filter 118 (FIG. 1). The output voltage $V_{OUT}$ is provided to the varactor 160 via the inductor 152 which provides an isolating function. An oscillatory voltage signal is formed on the connection 166 as a tuned output $V_T$ of the tuning and resonating block 112. The tuning and resonating block 112 thereby provides tuning of the VCO 120 at an output frequency dependent on input voltage $V_{OUT}$.

In practice, the tuning and resonating block 112 may be employed to provide fine tuning of the required frequency signal. Coarse tuning may be achieved by another circuit (not shown) operating in a different known manner. The active block 116, which may include a solid state active device such as a transistor device and its biasing circuits and feedback circuits, actively interacts with the tuned output $V_T$ and as a result of this the VCO oscillates.

Figure 3:
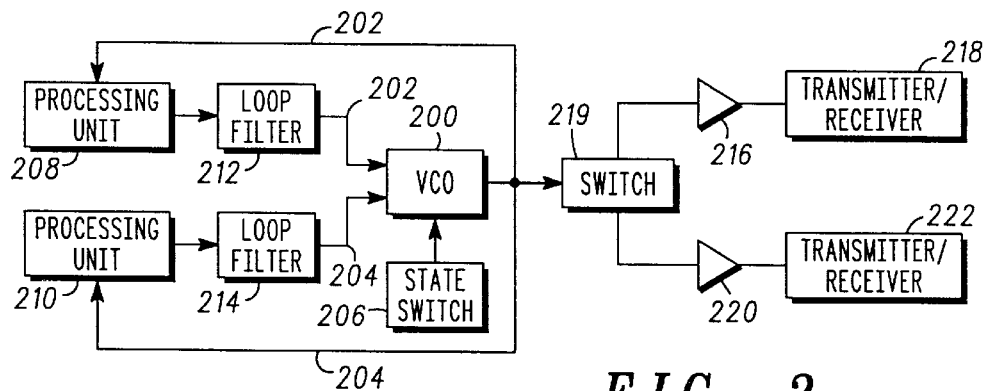
FIG. 3 is a block schematic circuit diagram of a dual phase locked loop circuit including a shared VCO part, the circuit embodying the present invention.

FIG. 3 illustrates schematically a circuit embodying the present invention. A VCO 200 is shared at least in part between a first mode phase locked loop 202 and a second mode phase locked loop 204. The state of the VCO 200 is selected by operation of a state switch 206 to be activated in either the loop 202 or the loop 204 but not both. The loop 202 when activated provides a feedback signal from the VCO 200 to a processing unit 208 and the loop 204 when activated provides a feedback signal from the VCO 200 to a processing unit 210. The units 208 and 210 respectively include the following items arranged and operating in a manner similar to corresponding items shown in and described earlier with reference to FIG. 1: a reference frequency source, a reference frequency divider, a controller, a feedback frequency divider and a phase detector. An output of the processor unit 208 is passed to a loop filter 212 and an output of the processor unit 210 is passed to a loop filter 214. In general, the operating characteristics of the unit 208 and its component items are different from the operating characteristics of the unit 210 and its component items. Outputs from the loop filters 212 and 214 respectively feed into the VCO 200.

When the first mode loop 202 is activated the second mode loop 204 is deactivated. The first mode loop and the VCO 200 together produce in the same manner as the conventional circuits shown in FIGS. 1 and 2 an output signal of the desired frequency for use in the first operational mode. This signal is delivered via a switch 219 to an amplifier 216 designed for use in the first operational mode and thence to a transmitter or receiver (as appropriate) circuit 218 operating in the first mode.

Similarly, when the second mode loop 204 is activated the first mode loop 202 is deactivated. The second mode loop 204 and the VCO 200 together produce in the same manner as the conventional circuits shown in FIGS. 1 and 2 a signal of the desired frequency for use in the second operational mode. This signal is delivered via the switch 219 to an amplifier 220 designed for use in the second operational mode and thence to a transmitter or receiver circuit 222 operating in the second mode.

The switch 219 has a state which is set to correspond to the state of the state switch 206. Thus, in the first operational mode the switch 219 delivers the output signal to the amplifier 216 and in the second operational mode the switch 219 delivers the output signal to the amplifier 220 as described above.

Figure 4:
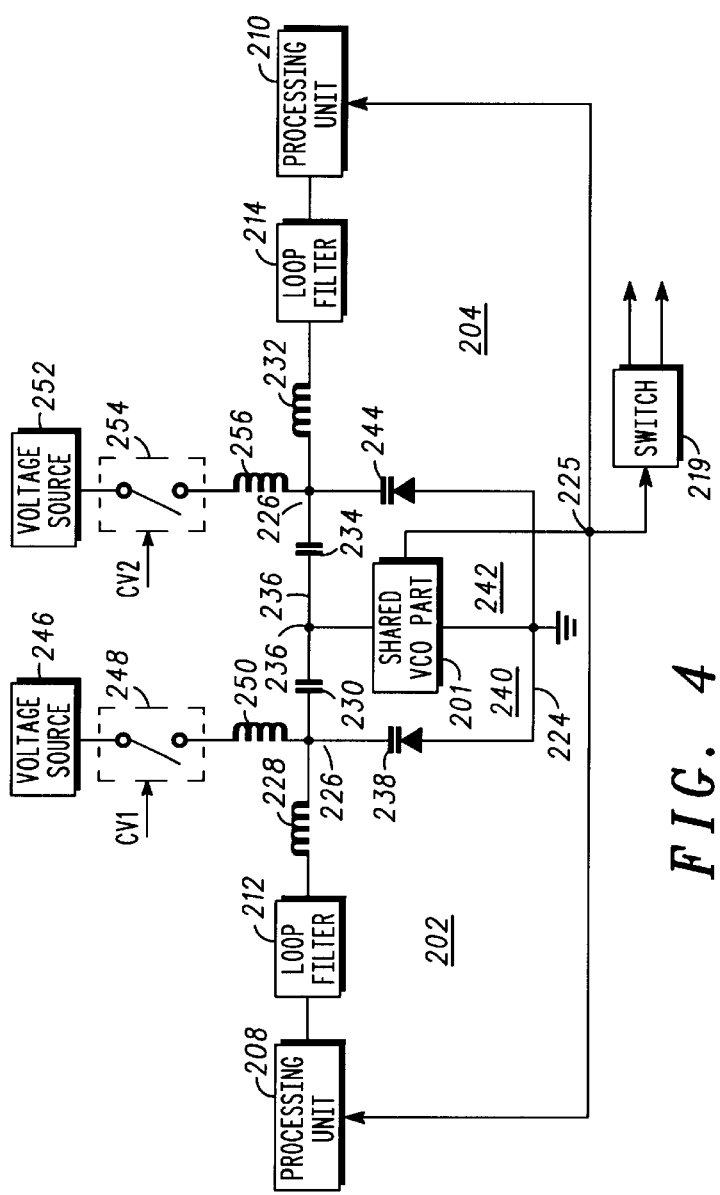
FIG. 4 is a circuit diagram partly in block schematic form of a more detailed arrangement for implementing the circuit shown in FIG. 3.

FIG. 4 is a circuit diagram, partly in block schematic form, of a more detailed arrangement for implementing the VCO/dual phase locked loop arrangement shown in FIG. 3. Items in FIG. 4 having the same reference numerals as those shown in FIG. 3 perform the same functions. A block 201 is labelled 'shared VCO part'. This is the part of the VCO 200 shown in FIG. 3 which is shared between the loops 202 and 204. In terms of the known VCO construction illustrated with reference to FIGS. 1 and 2 (VCO 120) the shared VCO part 201 of the VCO 200 comprises the VCO active block, the VCO resonator of the tuning and resonating block and the capacitor connecting the resonator and the active block. The shared VCO part 201 is connected at its input to a node 236 and at its output to a node 225. Part of the shared VCO part 201 (its resonator) is grounded at a grounded portion 224 in a known manner. The node 236 is in a non-grounded portion 226.

The node 225 provides an output connection in the first mode phase locked loop 202 to the processing unit 208 which provides in turn an output to the loop filter 212. The node 225 also provides an output connection in the second mode phase locked loop 204 to the processing unit 210 which in turn provides an output to the loop filter 214. The node 225 is also connected to the output switch 219.

An output lead from the loop filter 212 is connected via an inductor 228 and a capacitor 230 to the node 236. Likewise, an output lead from the loop filter 214 is connected via an inductor 232 and a capacitor 234 to the node 236.

A varactor 238 is connected between the grounded portion 224 and the non-grounded portion 226 between the inductor 228 and the capacitor 230, the connection being in parallel with that of the shared VCO part 201 thereby forming a control loop 240 with the shared VCO part 201. Likewise, a varactor 244 is connected between the grounded portion 224 and the non-grounded portion 226 between the inductor 232 and the capacitor 234, the connection being in parallel with that of the shared VCO part 201 thereby forming a control loop 242 with the shared VCO part 201. A voltage source 246 is connectable via an electrically controlled switch 248 and an inductor 250 to the varactor 238. Likewise, a voltage source 252 is connectable via an electrically controlled switch 254 and an inductor 256 to the varactor 244.

Figure 5:
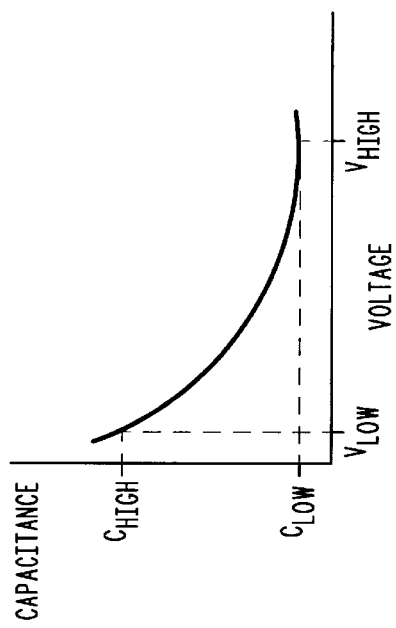
FIG. 5 is a graph of capacitance versus applied voltage for a varactor diode illustrating operation of varactor diodes employed in the circuit of FIG. 4.

FIG. 5 illusrates operation of the varactors 238 and 244. When the voltage applied across each varactor is low, e.g. less than a value $V_{LOW}$, e.g. 0.5 volts, the capacitance is high, $C_{HIGH}$. However, when the applied voltage is high, $V_{HIGH}$, e.g. 5 volts, the capacitance is low, $C_{LOW}$. For intermediate voltage values, the capacitance is on the curve shown between the values $C_{HIGH}$ and $C_{LOW}$.

In the first operational mode of the circuit shown in FIG. 4, the switch 254 which is controlled by an input control voltage signal CV2 is closed and a voltage of about 5 volts is applied from the voltage source 252 through the inductor 256 to the varactor 244. This causes the varactor 244 to be in its low capacitance state ($C_{LOW}$ in FIG. 2). The switch 248 is open and no voltage is applied through the inductor 250. An output from the processing unit 208 is integrated by the loop filter 212 and applied through the inductor 228 to the varactor 238. The varactor 238 thereby significantly influences the frequency of oscillations generated by the VCO 200 whereas the varactor diode 244 does not have a significant influence because of its constant low capacitance. The residual constant low capacitance does have a minor effect on the frequency of oscillations and this is taken into account during design of the circuit. The circuit therefore produces in a known manner as described earlier with reference to FIGS. 1 and 2 an output frequency determined by the input from the loop filter 212 as applied to the VCO 200, i.e. which comprises mainly the shared part 201 and the varactor 238, but which receives minor contributions from the capacitors 230 and 234 and the varactor 244.

In the second operational mode of the circuit shown in FIG. 4, the switch 248 which is controlled by the control voltage signal CV1 is closed and a voltage of about 5 volts is applied from the voltage source 246 through the inductor 250 to the varactor 238. This causes the varactor 238 to be in its low capacitance state ($C_{LOW}$ in FIG. 5). The switch 254 is open and no voltage is applied through the inductor 256. An output from the processing unit 210 is integrated by the second mode loop filter 214 and applied through the inductor 232 to the varactor 244. The varactor 244 thereby significantly influences the frequency of oscillations generated by the VCO 200 whereas the varactor 238 does not have significant influence because of its constant low capacitance. The residual constant low capacitance is taken into account during design of the circuit. The circuit therefore produces in a known manner as described earlier with reference to FIGS. 1 and 2 an output frequency determined by the input from the loop filter 210 as applied to the VCO 200, i.e. which comprises in this case mainly the shared part 201 and the varactor 244, but which receives minor contributions from the capacitors 230 and 234 and the varactor 238.

It should be noted that the varactors 238 and 244 in the circuit shown in FIG. 4 when not held at low capacitance provide the same function as the varactor 160 shown in FIG. 2 and the inductors 228 and 232 and the capacitors 230 and 234 of the circuit shown in FIG. 4 correspond respectively to the inductor 152 and the capacitor 156 of the circuit shown in FIG. 2.

It should be noted that the two synthesizer loops shown in FIGS. 3 and 4 connect at operational RF and not at loop filter baseband frequency. Connection at baseband frequency is not possible because switching at loop filter level is difficult. Connecting two loop filters to one varactor is not possible in a simple manner because of mutual loading and noise issues. However, the approach of the invention using one VCO is immune to interference that comes from noise from a 5 volt supply. This is because the phased locked loop suppresses this interference (behaves as a high pass filter).

What is claimed is:

1. A VCO (voltage controlled oscillator) circuit for connection and operation in a phase locked loop arrangement, the VCO circuit having a plurality of operational states in each of which the VCO circuit is operable to provide activation of a selected one of a plurality of different associated phase locked loops when connected to the VCO circuit, the VCO circuit including switching means for switching the state of the VCO circuit to allow the operational state of the VCO circuit to be selected, wherein the switching means comprises a plurality of electrical switches, each of the switches being connected to an associated part of the VCO circuit, whereby the operational state of the VCO circuit and the state of each associated phase locked loop is selectable, each phase locked loop in operation being activated or deactivated by closing of its associated switch in the VCO circuit.

2. A circuit according to claim 1 comprising a voltage source and a plurality of voltage controlled devices forming part of the VCO circuit, wherein each of the switches is connected between the voltage source and a corresponding one of the voltage controlled devices.

3. A circuit according to claim 2 wherein each of the voltage controlled devices comprises a varactor device.

4. A circuit according to claim 2 and comprising a plurality of VCO control loops and wherein each of the voltage controlled devices is connected in one of the plurality of VCO control loops, each of the VCO control loops being associated with one of a plurality of phase locked loops.

5. A circuit according to claim 4 wherein at least part of the VCO circuit is incorporated in each of the control loops.

6. A circuit according to claim 4 wherein each of the control loops comprises a grounded portion and a non-grounded portion and at least part of the VCO circuit comprises a common link in the control loops between the grounded and non-grounded portion of the control loops.

7. A circuit according to claim 4 wherein each of the switches is connected between a voltage source and a corresponding voltage controlled device forming part of the VCO circuit and wherein the voltage controlled device of each of the control loops is connected through one of a plurality of capacitors to a common input terminal to a shared part of the VCO.

8. A circuit according to claim 1 wherein an output terminal of the VCO is connected via a switch to a plurality of different output amplifiers associated with different operational modes, whereby an output signal from the VCO may be delivered to a selected one of the output amplifiers as determined by the state of the switch.

9. A frequency synthesizer circuit for use in radio communications to generate a stable frequency signal, the circuit comprising a VCO (voltage controlled oscillator) circuit in a phase locked loop arrangement, the synthesizer circuit comprising a plurality of different phase locked loops each including a loop filter having an output coupled to said VCO circuit and each having a first operable state in which the loop is activated and a second operable state in which the loop is deactivated and a VCO circuit at least part of which is connected in and shared by the loops the VCO circuit having a plurality of operational states in each of which the VCO circuit is operable to provide activation of a selected one of the different phase locked loops, the VCO circuit including switching means for switching the state of the VCO circuit to allow the operational state of the VCO to be selected based on the output of each said loop filter.

10. A synthesizer circuit according to claim 9 wherein the VCO circuit is shared by the phase locked loops in an active portion of the VCO circuit.

11. A synthesizer circuit according to claim 10 wherein the VCO circuit is also shared by the phase locked loops in a resonator portion of the VCO circuit.

12. A frequency synthesizer circuit for use in radio communications to generate a stable frequency signal, the circuit comprising a VCO (voltage controlled oscillator) circuit in a phase locked loop arrangement, the synthesizer circuit comprising a plurality of different phase locked loops each having a first operable state in which the loop is activated and a second operable state in which the loop is deactivated and a VCO circuit at least part of which is connected in and shared by the loops the VCO circuit having a plurality of operational states in each of which the VCO circuit is operable to provide activation of a selected one of the different phase locked loops, the VCO circuit including switching means for switching the state of the VCO circuit to allow the operational state of the VCO to be selected, wherein the switching means comprises a plurality of electrical switches each connected to an associated part of the VCO circuit, whereby the operational state of the VCO circuit and the state of each associated loop is selectable, each phase locked loop in operation being activated or deactivated by closing of its associated switch in the VCO circuit.

13. A synthesizer circuit according to claim 12 wherein each of the switches is connected between a voltage source and a corresponding voltage controlled device forming part of the VCO circuit.

14. A synthesizer circuit according to claim 12 wherein each of the voltage controlled devices comprises a varactor device.

15. A synthesizer circuit according to claim 13 and comprising a plurality of VCO control loops and wherein each voltage controlled device is connected in one of the plurality of VCO control loops, each of the VCO control loops being associated with one of a plurality of phase locked loops.

16. A frequency synthesizer circuit according to claim 15 wherein each of the control loops comprises a grounded portion and a non-grounded portion and at least part of the VCO comprises a common link in the control loops between the grounded and non-grounded portion of the control loops.

17. A frequency synthesizer circuit for use in radio communications to generate a stable frequency signal, the circuit comprising a VCO (voltage controlled oscillator) circuit in a phase locked loop arrangements, the synthesizer circuit comprising a plurality of different phase locked loops each having a first operable state in which the loop is activated and a second operable state in which the loop is deactivated and a VCO circuit at least part of which is connected in and shared by the loops the VCO circuit having a plurality of operational states in each of which the VCO circuit is operable to provide activation of a selected one of the different phase locked loops, the VCO circuit including switching means for switching the state of the VCO circuit to allow the operational state of the VCO to be selected, wherein each of the phase locked loops includes a capacitor, the capacitors of the phase locked loops being connected to a common input terminal to a part of the VCO circuit shared between the phase locked loops.

18. A frequency synthesizer circuit according to 12 wherein the voltage controlled device of each of the control loops is connected through one of the capacitors to the common input terminal to the shared part of the VCO.

19. A frequency synthesizer circuit for use in radio communications to generate a stable frequency signal, the circuit comprising a VCO (voltage controlled oscillator) circuit in a phase locked loop arrangements, the synthesizer circuit comprising a plurality of different phase locked loops each having a first operable state in which the loop is activated and a second operable state in which the loop is deactivated and a VCO circuit at least part of which is connected in and shared by the loops the VCO circuit having a plurality of operational states in each of which the VCO circuit is operable to provide activation of a selected one of the different phase locked loops, the VCO circuit including switching means for switching the state of the VCO circuit to allow the operational state of the VCO to be selected, wherein an output terminal of the VCO circuit is connected via a switch to a plurality of different output amplifiers associated with different operational modes, whereby an output signal from the VCO circuit may be delivered to a selected one of the output amplifiers as determined by the state of the switch.

20. A radio transmitter incorporating a frequency synthesizer circuit for use in radio communications to generate a stable frequency signal, the synthesizer circuit comprising a VCO (voltage controlled oscillator) circuit in a phase locked loop arrangement, the synthesizer circuit comprising a plurality of different phase locked loops each including a loop filter having an output coupled to said VCO circuit and each having a first operable state in which the loop is activated and a second operable state in which the loop is deactivated and a VCO circuit at least part of which is connected in and shared by the loops, the VCO circuit having a plurality of operational states in each of which the VCO circuit is operable to provide activation of a selected one of the different phase locked loops, the VCO circuit including switching means for switching the state of the VCO circuit to allow the operational state of the VCO to be selected based on the output of each said loop filter.

21. A radio transmitter according to claim 20 which in its different modes is operable to provide communications in at least two different digital communication systems.

22. A radio transmitter according to claim 21 which is operable to provide communications in at least the GSM and TETRA communications standard systems.

* * * * *